(12) United States Patent
Tsuboi et al.

(10) Patent No.: US 9,702,915 B2
(45) Date of Patent: Jul. 11, 2017

(54) SURFACE POTENTIAL DISTRIBUTION MEASURING DEVICE AND SURFACE POTENTIAL DISTRIBUTION MEASURING METHOD

(71) Applicants: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

(72) Inventors: Yuichi Tsuboi, Tokyo (JP); Shinichiro Yamada, Tokyo (JP); Tetsuo Yoshimitsu, Tokyo (JP); Kunihiko Hidaka, Tokyo (JP); Akiko Kumada, Tokyo (JP); Hisatoshi Ikeda, Tokyo (JP)

(73) Assignees: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

( * ) Notice: Subject to any disclaimer, the term of this patent is extended or adjusted under 35 U.S.C. 154(b) by 37 days.

(21) Appl. No.: 14/355,760

(22) PCT Filed: Nov. 21, 2012

(86) PCT No.: PCT/JP2012/007467
§ 371 (c)(1),
(2) Date: May 1, 2014

(87) PCT Pub. No.: WO2013/076975
PCT Pub. Date: May 30, 2013

(65) Prior Publication Data
US 2014/0300368 A1    Oct. 9, 2014

(30) Foreign Application Priority Data
Nov. 25, 2011 (JP) .................................. 2011-258147

(51) Int. Cl.
*G01R 29/14* (2006.01)
*G01R 15/24* (2006.01)
(Continued)

(52) U.S. Cl.
CPC ........... *G01R 29/14* (2013.01); *G01R 15/242* (2013.01); *G01R 31/1227* (2013.01); *G01R 31/34* (2013.01)

(58) Field of Classification Search
CPC .............. G01R 29/14; G02F 1/03; B41J 2/47
See application file for complete search history.

(56) References Cited

U.S. PATENT DOCUMENTS 4,510,441 A * 4/1985 Yasuda ................ G01R 15/242
324/415
4,786,176 A * 11/1988 Froome ................ G01S 7/4812
356/5.14
(Continued)

FOREIGN PATENT DOCUMENTS

JP    5-196672    8/1993
JP    5-307057    11/1993
(Continued)

OTHER PUBLICATIONS

Extended European Search Report issued Jun. 23, 2015 in Patent Application No. 12852419.6.
(Continued)

*Primary Examiner* — Huy Q Phan
*Assistant Examiner* — Alvaro Fortich
(74) *Attorney, Agent, or Firm* — Oblon, McClelland, Maier & Neustadt, L.L.P.

(57) ABSTRACT

In a surface potential distribution measuring device for an electric field reduction system of a rotating electrical machine, a Pockels crystal is used between a laser and the surface (test location) of the electric field reduction system.
(Continued)

Light intensity of a laser beam reflected on a mirror provided between the Pockels crystal and the test location corresponds to an output voltage that is the voltage difference between the first end surface and the second end surface of the Pockels crystal. Even when an inverter voltage is generated, by using a light detector having a frequency band capable of following the high frequency components of the inverter pulse voltage, the light intensity is detected by the light detector. Therefore, from the light intensity (output voltage), the surface potential distribution measuring device can measure the surface potential of the electric field reduction system in which an inverter pulse voltage is generated.

12 Claims, 8 Drawing Sheets

(51) Int. Cl.
    *G01R 31/34* (2006.01)
    *G01R 31/12* (2006.01)

(56) References Cited

U.S. PATENT DOCUMENTS

| | | | | |
|---|---|---|---|---|
| 4,937,457 | A * | 6/1990 | Mitchell | G01N 21/6408 250/458.1 |
| 4,999,570 | A * | 3/1991 | Ehrler | G01R 15/242 324/96 |
| 5,055,770 | A * | 10/1991 | Takahashi | G01R 15/242 324/72.5 |
| 5,420,686 | A * | 5/1995 | Takahashi | G01R 15/242 356/491 |
| 6,057,677 | A | 5/2000 | Wakana et al. | |
| 6,259,244 | B1 * | 7/2001 | Wakana | G01R 31/308 324/754.23 |
| 2005/0084801 | A1 * | 4/2005 | El-Hafidi | G11B 7/0065 430/289.1 |
| 2008/0018977 | A1 * | 1/2008 | Bergmann | G02F 1/0327 359/257 |
| 2009/0219378 | A1 * | 9/2009 | Nakamura | G02F 1/03 347/255 |
| 2010/0296531 | A1 * | 11/2010 | Hohm | A61B 18/203 372/12 |

FOREIGN PATENT DOCUMENTS

| | | |
|---|---|---|
| JP | 7-501888 A | 2/1995 |
| JP | 7-181211 | 7/1995 |
| JP | 2004-525361 | 8/2004 |
| JP | 2011-22007 | 2/2011 |
| WO | WO 93/12435 A1 | 6/1993 |

OTHER PUBLICATIONS

Kunihiko Hidaka, "Electric Field and Voltage Measurement by Using Electro-Optic Sensor", High Voltage Engineering Symposium, vol. 2, XP006501537, Aug. 23, 1999, 14 pages.

International Search Report issued Feb. 26, 2013, in PCT/JP12/007467 filed Nov. 21, 2012.

Combined Chinese Office Action and Search Report issued Sep. 17, 2015 in Patent Application No. 201280057715.X (with partial English language translation and English translation of categories of cited documents).

Office Action issued on Mar. 23, 2016 in Canadian Patent Application No. 2,856,201.

Office Action issued on Mar. 15, 2017 in Canadian Patent Application No. 2,856,201. (3 pages).

* cited by examiner

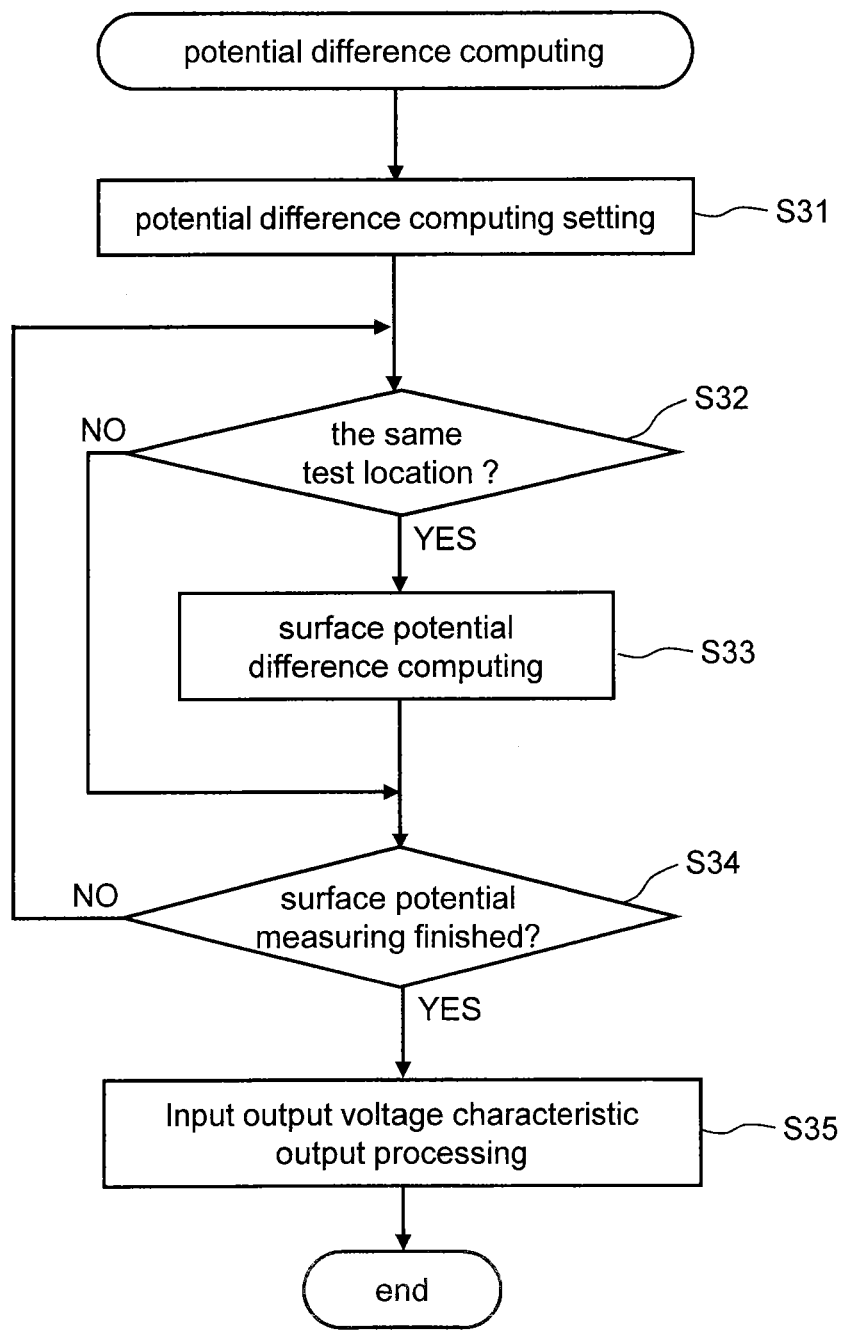

US 9,702,915 B2

SURFACE POTENTIAL DISTRIBUTION MEASURING DEVICE AND SURFACE POTENTIAL DISTRIBUTION MEASURING METHOD

TECHNICAL FIELD

The present invention relates to a surface potential distribution measuring device and a surface potential distribution measuring method for an object to be measured.

BACKGROUND ART

An inverter-driven rotating electrical system that drives a rotating electrical machine using an inverter is now developed and widely used. In this inverter-driven system, the inverter transforms a DC voltage into a pulse voltage through switching operation and supplies the pulse voltage to the rotating electrical machine through cables. The rotating electrical machine is driven by a power of this pulse voltage.

Conventionally, in a high-voltage rotating electrical machine, an electric field reduction system is often applied to a surface of a coil provided around a stator core end portion in order to prevent occurrence of a partial discharge or heat generation, especially, around a core end portion of a stator coil. In the electric field reduction system, a low resistance layer led from an inside of a stator core slot and an electric field reducing layer formed so as to overlap a part of the low resistance layer are combined.

On the other hand, in the inverter-driven system, a reflected wave may occur by impedance mismatching among the inverter, the cables, and the rotating electrical machine. If the reflected wave is superimposed on the pulse voltage, high-voltage noise, so-called inverter surge may occur between the cables and the rotating electrical machine, especially, at a connecting portion between the cables and the rotating electrical machine.

When the pulse voltage including the inverter surge (hereinafter, referred to as "inverter pulse voltage") repeatedly occurs, the partial discharge and heat generation at the stator coil of the core end portion (hereinafter, referred to as "stator coil end") which are caused during operating time by commercial frequency become more serious. And the partial discharge and heat generation also cause on the electric field reduction system. As a result, the reliability of the stator coil may be significantly affected.

The partial discharge and heat generation depend on a surface potential of the electric field reduction system (see Non-patent Document 1). Thus, there has been a strong need for a technology that accurately measures the surface potential of the electric field reduction system in which the inverter pulse voltage is generated.

PRIOR ART DOCUMENTS

Patent Documents

Patent Document 1: Japanese Patent Application Laid-Open Publication No. 2011-22007

Non-Patent Documents

Non-Patent Document 1: Akiko Kumada, Masakuni Chiba, and Kunihiro Hidaka "The Direct Potential Distribution Measurement of Propagating Surface Discharge by Using Pockels Effect", the transactions of the Institute of Electrical Engineers of Japan A, Vol. 118-A, No. 6, pp. 723-728 (1998-6).

SUMMARY OF THE INVENTION

Problems to be Solved by the Invention

Typically, a surface electrometer is used in measurement of the surface potential (see Patent Document 1). In a technology described in Patent Document 1, a probe is brought into contact with or close to the electric field reduction system, and the surface potential is measured by the surface electrometer. The surface potential is used to calculate a non-linear resistance.

However, the inverter pulse voltage has a high-frequency component of kHz order or more. In this case, the surface electrometer cannot follow the high-frequency component and thus cannot measure the surface potential of the electric field reduction system in which the inverter pulse voltage is generated.

Typically, as the probe, a metal material is used. Thus, in the above method in which the probe is brought into contact with or close to the electric field reduction system, static electricity may occur between the electric field reduction system and the probe. In addition, when the inverter surge occurs, a corona discharge may occur between the electric field reduction system and the probe. As described above, in a case where a metal material is used as a measurement point, the surface potential of the electric field reduction system in which the inverter pulse voltage is generated cannot be measured due to disturbance to an object to be measured.

An object of the present invention is to measure the surface potential of the object to be measured in which the pulse voltage is generated.

Means for Solving the Problem

According to the present invention, there is provided a surface potential distribution measuring device comprising: a laser configured to emit laser light; a Pockels crystal configured to receive, at its first end surface, the laser light emitted from the laser; a mirror having a mirror surface at a second end surface of the Pockels crystal and configured to reflect the laser light incident from the first end surface of the Pockels crystal in a direction opposite to an incident direction of the laser light; a light detector having a band following a high-frequency component of a pulse voltage and configured to receive the laser light reflected by the mirror and detecting, as a light intensity of the laser light, a detection light intensity corresponding to an output voltage which is a potential difference between the first end surface of the Pockels crystal and the second end surface thereof; a voltage calibration database configured to store, when a plurality of mutually different input voltages are applied to a rear surface of the mirror in voltage calibration processing to be performed before a test, input-to-output voltage characteristics representing a relationship between the different input voltages and the output voltages of the Pockels crystal obtained when the different input voltages are applied to the rear surface of the mirror; and a computing section configured to set, when a part of a surface of an object to be measured is set at a rear side of the mirror as a test location in surface potential measurement processing to be performed during the test, the output voltage of the Pockels crystal obtained when a voltage is applied to the object as an output voltage at test time and identifying an input voltage corresponding to the output voltage at test time as the surface potential of the object based on the input-to-output voltage characteristics stored in the voltage calibration database.

According to the invention, there is also provided a surface potential distribution measuring method comprising: a step in which a laser emits laser light from a first end surface of a Pockels crystal to a second end surface thereof; a step in which a mirror, having a mirror surface at the second end surface of the Pockels crystal, reflects the laser light incident thereto from the first end surface of the Pockels crystal in a direction opposite to an incident direction of the laser light; a step in which a light detector, having a band following a high-frequency component of all inverter pulse voltage, detects the laser light reflected by the mirror and detects, as a light intensity of the laser light, where a detection light intensity corresponds to an output voltage which is a potential difference between the first end surface of the Pockels crystal and the second end surface thereof; a step in which a computing unit stores in a voltage calibration database, when a plurality of mutually different input voltages are applied to a rear surface of the mirror in voltage calibration processing to be performed before a test, input-to-output voltage characteristics representing a relationship between the different input voltages and the output voltages of the Pockels crystal obtained when the different input voltages are applied to the rear surface of the mirror; and a step in which the computing unit sets, when a part of a surface of an object to be measured is set at a rear side of the mirror as the test location in surface potential measurement processing to be performed during the test, the output voltage of the Pockels crystal obtained when a voltage is applied to the object as an output voltage at the test and identifying an input voltage corresponding to the output voltage at the test as the surface potential of the object based on the input-to-output voltage characteristics stored in the voltage calibration database.

Advantage of the Invention

According to the present invention, the surface potential of the object to be measured in which the pulse voltage is generated can be measured.

BRIEF DESCRIPTION OF THE DRAWINGS

FIG. 8 is a flowchart illustrating an example of potential difference computing processing.

EMBODIMENTS FOR CARRYING OUT THE INVENTION

Embodiments of a surface potential distribution measuring device according to the present invention will be described with reference to the drawings.

First Embodiment

Figure 1:
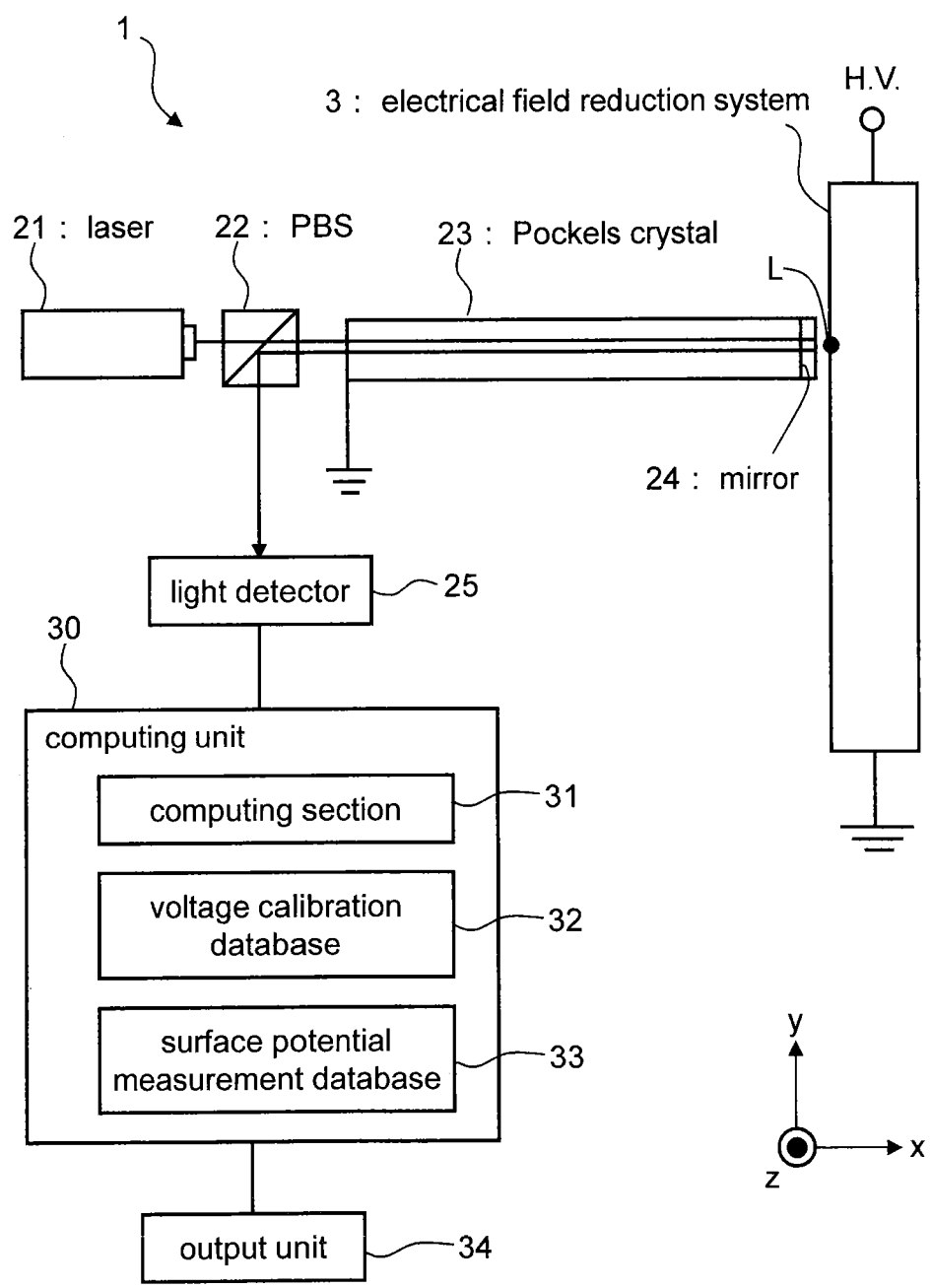
FIG. 1 is a block diagram illustrating a configuration of a surface potential distribution measuring device according to a first embodiment.
Figure 2:
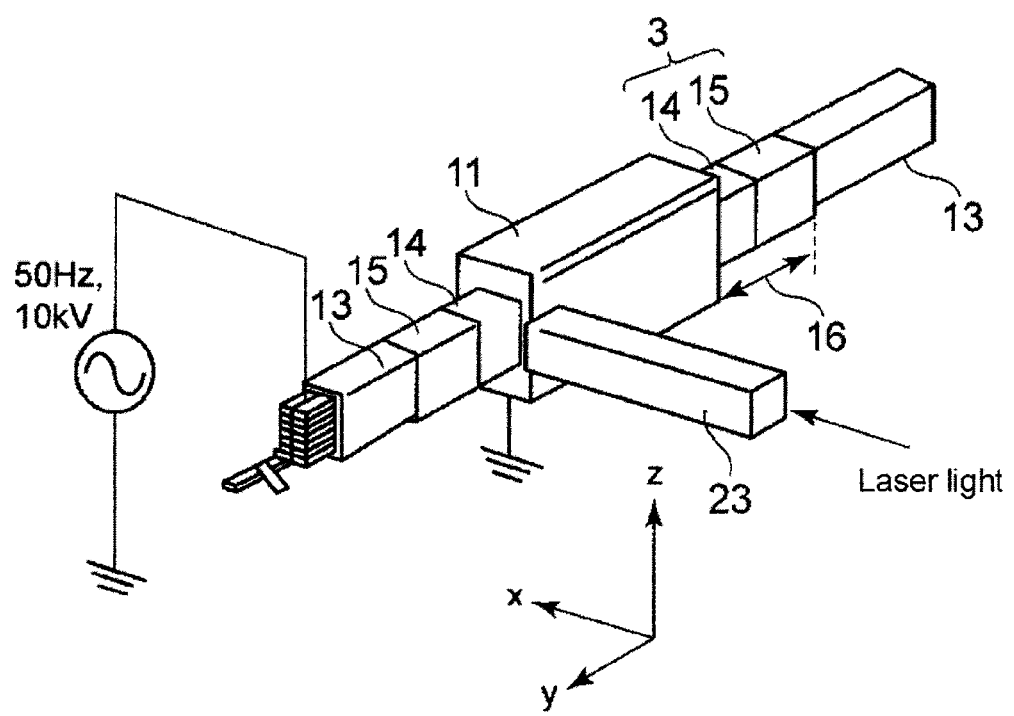
FIG. 2 is a perspective view schematically illustrating a stator of a rotating electrical machine, an electric field reduction system, and a Pockels crystal of the surface potential distribution measuring device.

FIG. 1 is a block diagram illustrating a configuration of a surface potential distribution measuring device 1 according to a first embodiment. FIG. 2 is a perspective view schematically illustrating a stator of a rotating electrical machine, an electric field reduction system 3, and a Pockels crystal 23 of the surface potential distribution measuring device 1.

The surface potential distribution measuring device 1 is applied to the electric field reduction system 3. The electric field reduction system 3 is applied to an inverter-driven rotating electrical machine.

The rotating electrical machine will be described using FIG. 2. In FIG. 2, constituent elements not directly related to the electric field reduction system 3 to be described later are omitted.

The rotating electrical machine includes a stator and a rotor. The rotor is disposed inside the stator and rotates therein.

The rotor includes a rotor shaft, a rotor core, and a rotor coil. The rotor core rotates together with the rotor shaft. The rotor coil is wound around the rotor core.

The stator includes a stator core 11, a stator coil, and a main insulating layer 13.

The stator core 11 is disposed outside the rotor in a radial direction thereof with a gap therebetween. Slots are formed at predetermined intervals along an inner peripheral surface of the stator core 11.

A half-turn coil, which is a coil conductor 12, is housed in each of the slots. The half-turn coils are connected to each other outside the stator core. That is, the half-turn coils are electrically connected to constitute the stator coil. This stator coil is provided for each of a U-phase, a V-phase, and a W-phase, whereby three-phase winding coils of U, V and W-phases are produced.

The main insulating layer 13 for making insulating coating for the stator coil is provided on an outer periphery of the stator core. Specifically, a ground insulating tape mainly formed of mica-epoxy is wound around the outer periphery of the stator coil as the main insulating layer 13 (see FIG. 4).

An end portion (hereinafter, referred to as "stator coil end 16") of the stator coil on which the main insulating layer 13 is provided does not directly contribute to power generation, so that the connecting portion between the half-turn coils in the stator coil end 16 is formed into a three-dimensionally curved shape, so-called an involute shape. This allows the rotating electrical machine to be compact.

The electric field reduction system 3 for preventing occurrence of a corona discharge to be described later is applied to the stator coil end 16. The following describes the electric field reduction system 3 using FIG. 2.

The electric field reduction system 3 includes a low resistance layer 14 and an electric field reducing layer 15.

A partial discharge which is a corona discharge may occur between the main insulating layer 13 of the stator coil end 16 and a part of the stator core 11 that faces a slot wall surface. In order to prevent occurrence of the partial discharge, the low resistance layer 14 is provided on the outer periphery of the main insulating layer 13. Specifically, as the low resistance layer 14, a low-resistance semiconducting tape is wound around the outer periphery of the main insulating layer 13 from a portion at which the main insulating layer 13 faces an inner periphery of the stator core 11 to a portion at which the main insulating layer 13 is exposed outside from the stator core 11 (see FIG. 4). A width of the low resistance layer 14 provided outside the stator core 11 (hereinafter, referred to as "end portion 17 of the low resistance layer 14") is about several tens of millimeters.

The low resistance layer 14 is grounded together with the stator core 11. Thus, when a voltage (AC voltage) is applied to the coil conductor 12, the coil conductor 12 serves as a drive electrode, and the low resistance layer 14 serves as a ground electrode. In this case, equipotential lines generated between the coil conductor 12 and the low resistance layer 14 in the stator core 11 are substantially parallel. On the other hand, equipotential lines generated between the coil conductor 12 and the low resistance layer 14 at the stator coil end 16 are distributed in a thickness direction of the main insulating layer 13. At the stator coil end 16, the equipotential lines are densely distributed, depending on a difference in relative permittivity between the main insulating layer 13 and the coil conductor 12 or resistivity of a surface of the coil conductor 12. Thus, potential gradient is increased on a surface of the stator coil end 16, with the result that an electric field is concentrated along the surface of the stator coil end 16. Particularly, at the end portion 17 of the low resistance layer 14, the potential gradient is significantly increased, so that the partial discharge or surface discharge which is the corona discharge is likely to occur. Therefore, in order to prevent occurrence of the partial discharge or surface discharge, the electric field reducing layer 15 is provided on the outer peripheries of the end portion 17 of the low resistance layer 14 and the main insulating layer 13 of the stator coil end 16. Specifically, as the electric field reducing layer 15, a high-resistance semiconducting tape for reducing the potential gradient is wound around the outer periphery of the main insulating layer 13 of the stator coil end 16 so as to cover the end portion 17 of the low-resistance layer 14 (see FIG. 4).

The following describes the surface potential distribution measuring device 1 using FIG. 1. The surface potential distribution measuring device 1 measures a surface potential of the electric field reduction system 3 applied to the stator coil end 16.

The surface potential distribution measuring device 1 includes a semiconductor laser generator (hereinafter, referred to as "laser") 21, a polarization beam splitter (hereinafter, referred to as "PBS") 22, the Pockels crystal 23, a dielectric mirror (hereinafter, referred to as "mirror") 24, a light detector 25, and a computing unit 30.

The laser 21 emits laser light in an incident direction (x-direction) perpendicular to a longitudinal direction (y-direction) of the electric field reduction system 3. The laser light has a wavelength of 532.00 nm, a maximum output power of 10 mW, and a beam diameter of 0.34 mm. Although the wavelength of the laser light is set to 532.0 nm, it is not limited, as long as the laser light can propagate through the Pockels crystal 23 and the optical components without significant attenuation.

The laser light is linearly polarized light, and a polarization plane of the linearly polarized light is parallel to a direction (z-direction) perpendicular both to the incident direction x and the longitudinal direction y.

The PBS 22 transmits therethrough only the above-mentioned linearly polarized light. The PBS 22 transmits therethrough the laser light emitted from the laser 21 in the incident direction x.

The Pockels crystal 23 is disposed such that a longitudinal direction thereof is parallel to the incident direction x and is disposed in line with the laser 21 and the PBS 22 in the incident direction x. A first end surface of the Pockels crystal 23 is grounded. Alternatively, the first end surface of the Pockels crystal 23 may be set to 0 [V] by a power supply unit. The laser light from the PBS 22 enters the first end surface of the Pockels crystal 23 and travels toward a second end surface thereof that does not intersect the first end surface.

A surface of the mirror 24 is mounted on the second end surface of the Pockels crystal 23. A voltage is applied to a the second end surface of the mirror 24 from an object to be measured. That is, a voltage is applied to the second end surface of the Pockels crystal 23. The object to be measured is the electric field reduction system 3.

A part of a surface of the electric field reduction system 3 is set as a test location at a rear side of the mirror 24. Specifically, the rear surface of the mirror 24 is spaced apart from the test location by a predetermined distance. The predetermined distance is set to 1 mm in the present embodiment; however, it may be changed inconsideration of spatial resolution. The mirror 24 reflects the laser light entering the first end surface of the Pockels crystal 23 in a direction opposite to the incident direction x.

The Pockels crystal 23 is a piezoelectric isotropic crystal belonging to "crystal point group 3m" and generates a Pockels effect. The Pockels effect is a phenomenon where birefringence is observed when an electric field (voltage) is applied to an isotropic crystal of a dielectric body. And a refractive index (light intensity) changes in proportion to the applied voltage. As the Pockels crystal 23, a BGO (Bi12Geo20) crystal can be exemplified.

The Pockels crystal can be made to have sensitivity to a component parallel or perpendicular to a propagation direction of light of an external electric field depending on angle between the propagation direction of the incident light and the crystal orientation. The former is referred to as "longitudinal modulation" and the latter as "transversal modulation". The Pockels crystal belonging to "crystal point group 3m" is a crystal that can make the longitudinal modulation arrangement. In this longitudinal modulation arrangement, light intensity changes in proportion to an integrated value of a component of the external electric field parallel to an optical path, i.e., voltage.

The light intensity of the laser light reflected by the mirror 24 corresponds to an output voltage VPout which is a potential difference between the first end surface of the Pockels crystal 23 and the second end surface thereof (hereinafter, referred also to as "between both surfaces" of the Pockels crystal 23).

The PBS 22 transmits therethrough the laser light reflected by the mirror 24 in the longitudinal direction y (in the present embodiment, a direction opposite to the longitudinal direction y).

The light detector 25 has a band following a high-frequency component of an inverter pulse voltage. The light detector 25 is disposed in the longitudinal direction y (in the present embodiment, a direction opposite to the longitudinal direction y) with respect to the PBS 22. The light detector 25 receives the laser light from the PBS 22 and detects a detection light intensity Pout as the light intensity of the laser light.

The detection light intensity Pout corresponds to the output voltage VPout which is a potential difference between the first end surface of the Pockels crystal 23 and the second end surface thereof. The detection light intensity Pout is represented as the following expression as a cosine function of the output voltage VPout.

$$Pout=(Pin/2)\times\{1-\cos(\pi(VPout/V\pi)-\theta 0)\}.$$

In the cosine function, Pin is an incident light intensity of the Pockels crystal 23, $V\pi$ is a half wavelength voltage, and $\theta 0$ is a phase difference (arbitrary value) to be provided by a wave length plate. In the present embodiment, the output voltage VPout of the Pockels crystal 23 is computed based on the detection light intensity Pout and according to an inverse function of the above cosine function. As the Pockels crystal 23, a comparatively long crystal of 100 mm is used, so that disturbance of the electric field distribution on a surface of the dielectric body due to approach of the Pockels crystal 23 is small. Therefore, the output voltage VPout of the Pockels crystal 23 is proportional to the surface potential of the electric field reduction system 3 to be measured.

The computing unit 30 is a computer connected to the light detector 25 and an output unit 34. The computing unit 30 includes a CPU (Central Processing Unit) and a storage unit. The storage unit stores a computer program. The CPU reads out and executes the computer program. As the output unit 34, a display or a printer can be exemplified. The computing unit 30 includes, as functional blocks of the CPU, a computing section 31, a voltage calibration database 32, and a surface potential measurement database 33.

The following describes operation of the surface potential distribution measuring device 1 according to the first embodiment.

The surface potential distribution measuring device 1 performs voltage calibration processing to be described later before execution of a test, and then performs surface potential measurement processing to be described later during the test. The computing section 31 constructs the voltage calibration database 32 through the voltage calibration processing, and refers to the voltage calibration database 32 during the surface potential measurement processing. To the computing section 31, the voltage calibration processing or surface potential measurement processing is set by, e.g., an input operation of an operator.

Figure 5:
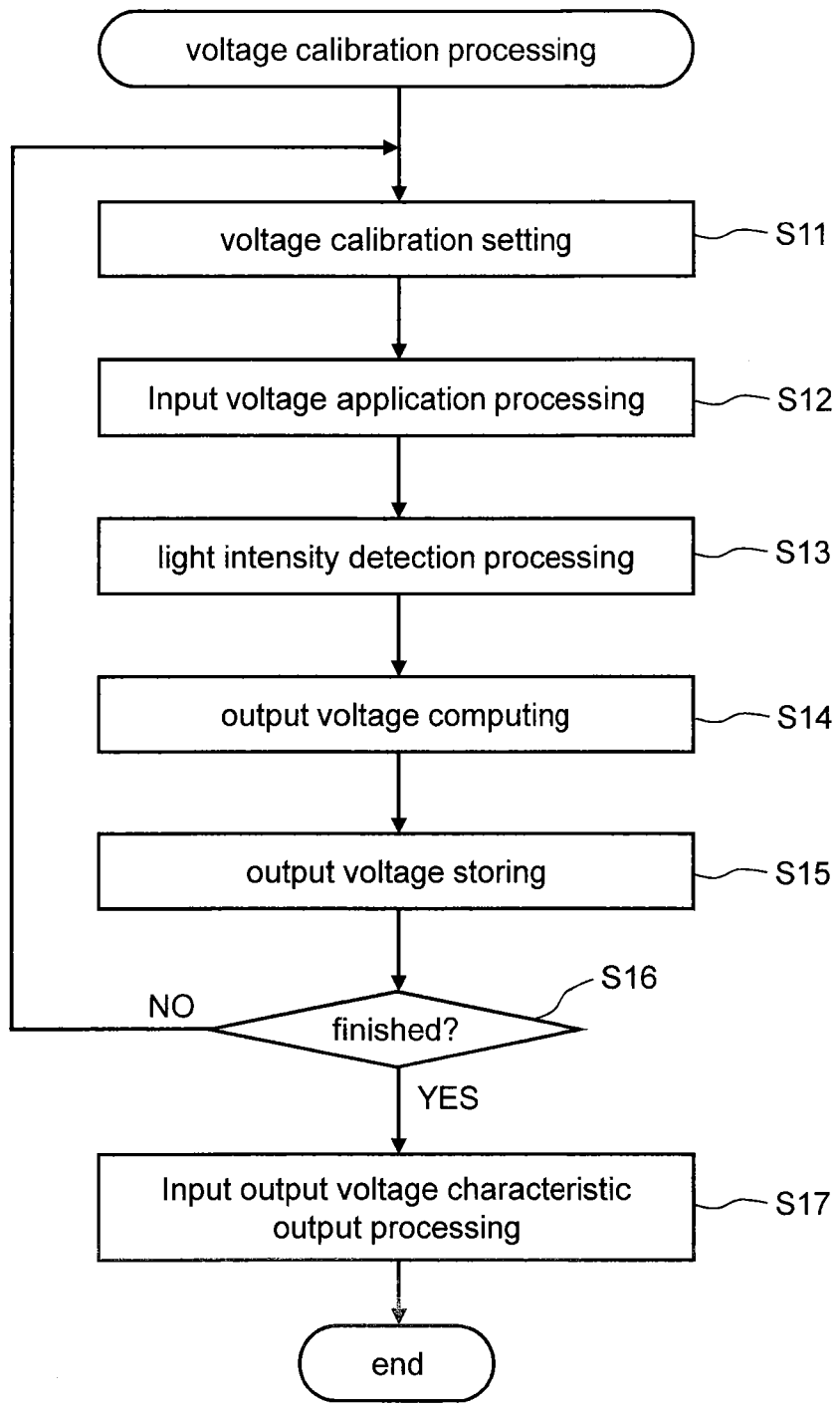
FIG. 5 is a flowchart illustrating an example of voltage calibration processing.

FIG. 5 is a flowchart illustrating an example of the voltage calibration processing.

First, the voltage calibration processing is set to the computing section 31 (step S11: voltage calibration setting).

Then, an AC voltage of, e.g., 50 Hz is applied, as an input voltage Vin [kV] to the rear surface of the mirror 24 provided at the second end portion of the Pockels crystal 23 of the surface potential distribution measuring device 1 (step S12: input voltage application processing).

In this state, the laser light emitted from the laser 21 reaches the mirror 24 through the PBS 22 and the Pockels crystal 23 and reflected thereby. The laser light reflected by the mirror 24 enters the light detector 25 through the Pockels crystal 23 and the PBS 22. The light detector 25 detects the light intensity of the laser light from the PBS 22 as the detection light intensity Pout (step S13: light intensity detection processing).

In the voltage calibration processing, the computing section 31 performs the following processing.

First, the computing section 31 uses the above cosine function to compute the output voltage VPout [V] of the Pockels crystal 23 from the detection light intensity Pout. That is, the output voltage VPout [V] corresponding to the detection light intensity Pout is derived based on the detection light intensity Pout (step S14: output voltage computing).

The computing section 31 stores the output voltage VPout [V] in the voltage calibration database 32 together with the above input voltage Vin [kV] input through the input operation of the operator (step S15: output voltage storing).

Thereafter, when the voltage calibration processing is not finished (NO in step S16), the computing section 31 repeats the processing of steps S11 to S15 while changing the input voltage Vin [kV].

As a result, input-to-output voltage characteristics representing a relationship between the different input voltages Vin [kV] and their corresponding output voltages VPout [V] of the Pockels crystal 23 are stored in the voltage calibration database 32. That is, the input-to-output voltage characteristics as illustrated in FIG. 3 are generated to construct the voltage calibration database 32.

Figure 3:
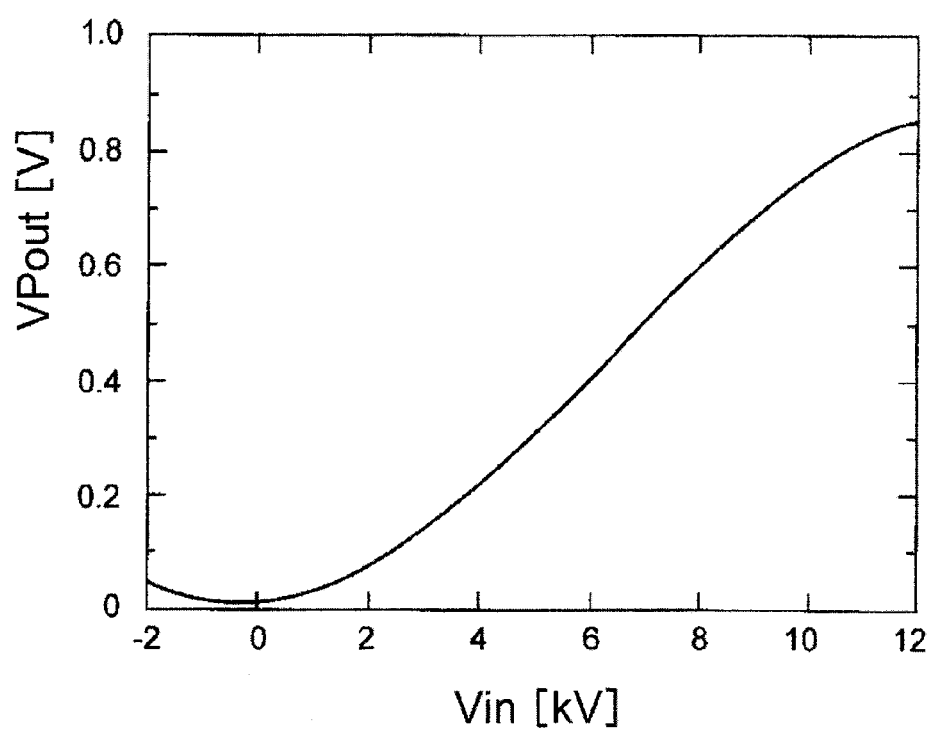
FIG. 3 is a view illustrating input-to-output voltage characteristics in voltage calibration processing.

FIG. 3 is a view illustrating the input-to-output voltage characteristics in the voltage calibration processing. The computing section 31 refers to the voltage calibration database 32, and performs fitting based on the relationship between the different input voltages Vin [kV] and their corresponding output voltages VPout [V] of the Pockels crystal 23 to compute a relational expression on the voltage calibration. Then, the computing section 31 obtains the input-to-output voltage characteristics as illustrated in FIG. 3.

When the voltage calibration processing is finishded (YES in step S16), the computing section 31 outputs the input-to-output voltage characteristics stored in the voltage calibration database 32 to the output unit 34. When the output unit 34 is a display, the input-to-output voltage characteristics are displayed on the display; when the output unit 34 is a printer, the input-to-output voltage characteristics are printed by the printer (step S17: input-to-output voltage characteristics output processing).

Figure 6:
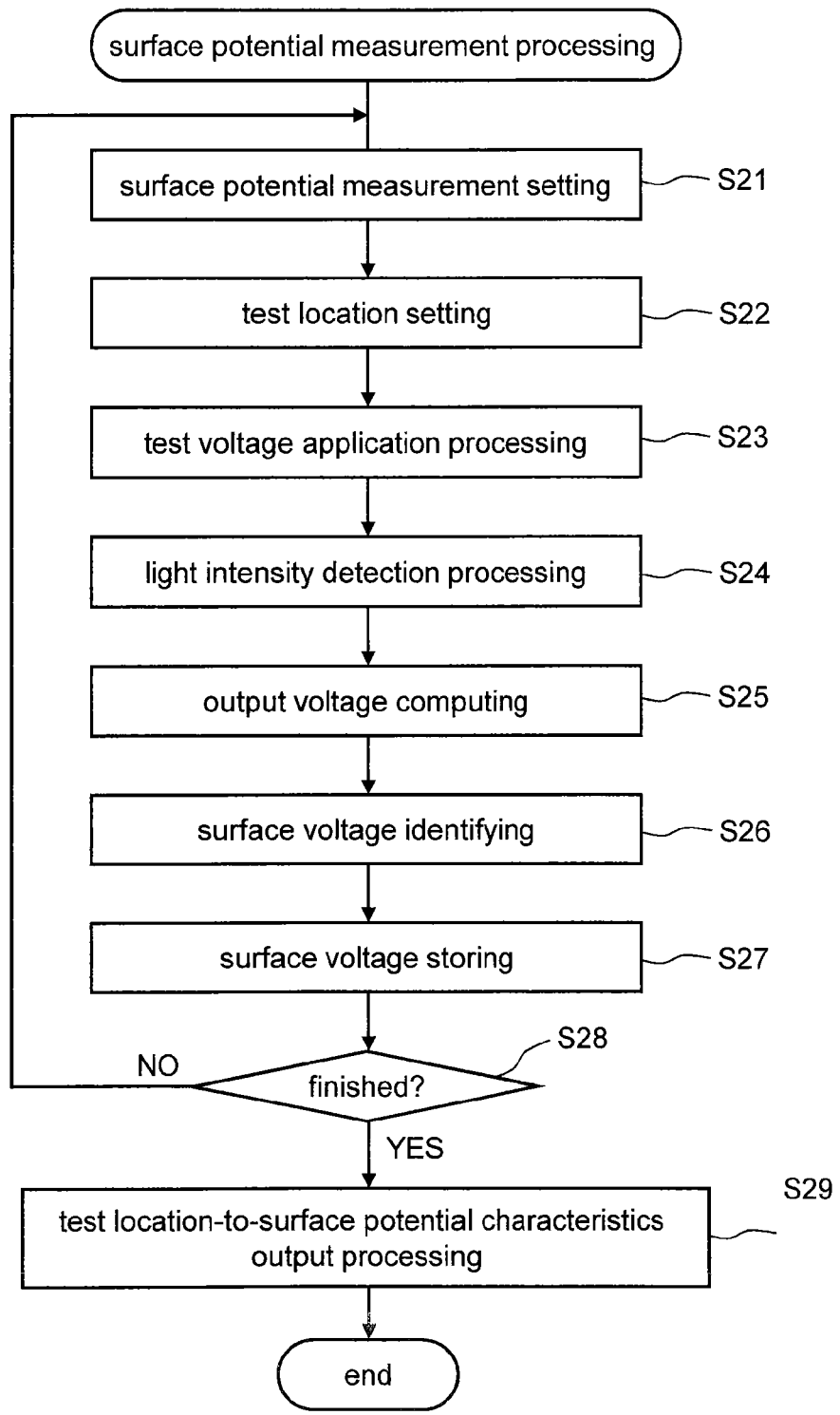
FIG. 6 is a flowchart illustrating an example of surface potential measurement processing.

FIG. 6 is a flowchart illustrating an example of the surface potential measurement processing.

First, the surface potential measurement processing is set to the computing section 31 (step S21: surface potential measurement setting).

Then, a part of the surface of the electric field reduction system 3 is set as a test location at the rear side of the mirror 24 provided at the second end portion of the Pockels crystal 23 of the surface potential distribution measuring device 1. One end portion of the stator coil end 16 that contacts the stator core 11 is set as a first position P (P=0) [mm], and the other end portion thereof is set as a second position Q [mm]. In this case, a test location L [mm] represents a distance extending from the first position P in the longitudinal direction y (step S22: test location setting).

Then, an AC voltage of, e.g., 50 Hz having a peak value of 10 kV is applied, as a test voltage, to the stator coil of the rotating electrical machine (step S23: test voltage application processing).

In this state, the laser light emitted from the laser 21 reaches the mirror 24 through the PBS 22 and the Pockels crystal 23 and reflected thereby, and the laser light reflected by the mirror 24 enters the light detector 25 through the Pockels crystal 23 and the PBS 22. The light detector 25 detects the light intensity of the laser light from the PBS 22 as the detection light intensity Pout (step S24: light intensity detection processing).

In the surface potential measurement processing, the computing section 31 performs the following processing.

First, the computing section 31 uses the above cosine function to compute the output voltage VPout [V] of the Pockels crystal 23 from the detection light intensity Pout. That is, the output voltage VPout [V] corresponding to the detection light intensity Pout is derived based on the detection light intensity Pout. Here, the output voltage VPout [V] is set as an output voltage Vout [V] at test time (step S25: output voltage computing).

The computing section 31 refers to the input-to-output voltage characteristics stored in the voltage calibration database 32 to identify the input voltage Vin [kV] corresponding to the output voltage Vout [V] at test time as a surface potential Vsuf [kV] of the electric field reduction system 3 (step S26: surface potential identifying).

The computing section 31 stores the surface potential Vsuf [kV] in the surface potential measurement database 33 together with the above test location L [mm] input through the input operation of the operator (step S27: surface potential storing).

Thereafter, when the surface potential measurement processing is not finished (NO in step S28), the computing section 31 repeats the processing of steps S21 to S27 while changing the test location L [mm]. For example, when the test location L is set at different positions in an area from the first position P to second position Q with respect to the rear surface of the mirror 24, the computing section 31 stores the different test locations L [mm] and their corresponding surface potentials Vsuf [kV] of the electric field reduction system 3 in the surface potential measurement database 33.

As a result, test location-to-surface potential characteristics representing a relationship between the different test locations L [mm] and their corresponding surface potentials Vsuf [kV] of the electric field reduction system 3 are stored in the surface potential measurement database 33. That is, the computing section 31 uses the surface potential measurement database 33 to generate the test location-to-surface potential characteristics as illustrated in FIG. 4.

Figure 4:
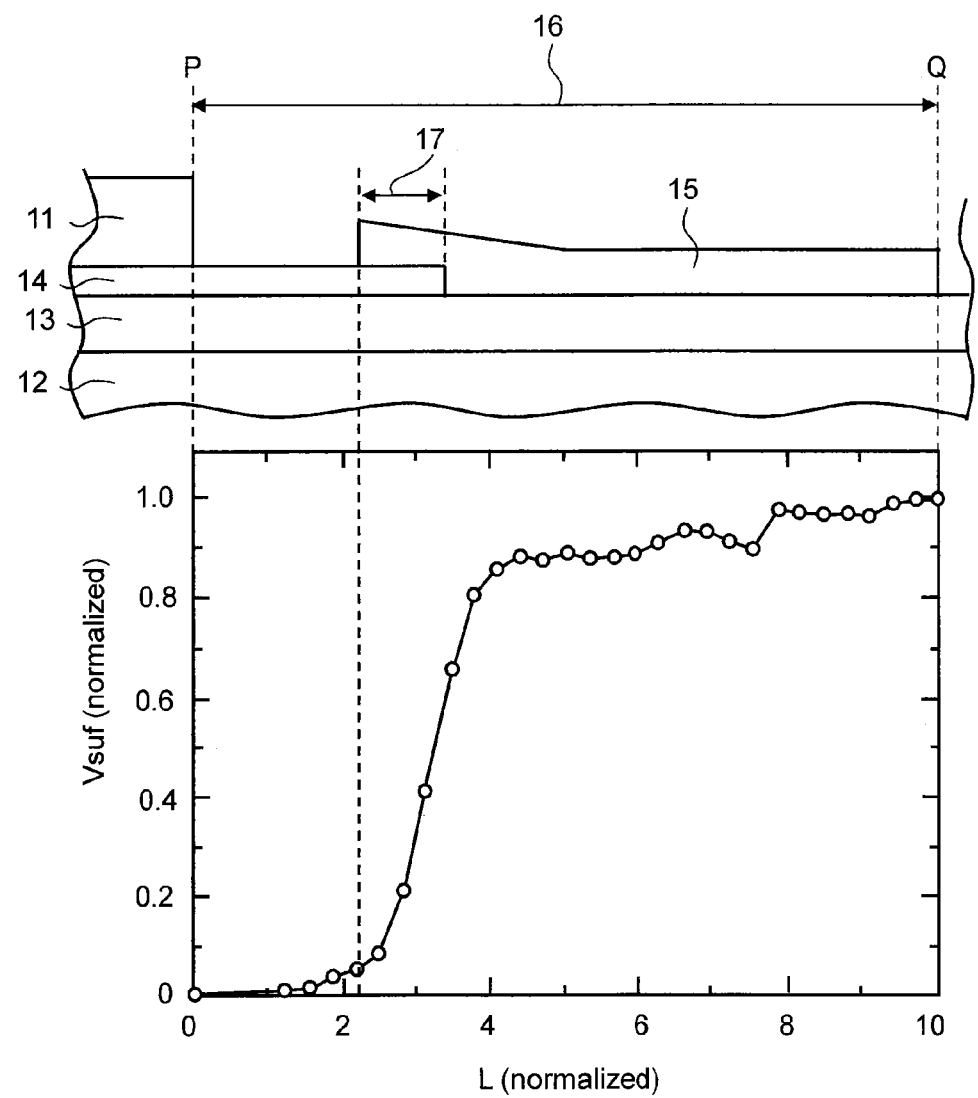
FIG. 4 is a view illustrating, in association with schematic cross sections of the stator of the rotating electrical machine and the electric field reduction system, test location-to-surface potential characteristics in surface potential measurement processing.

FIG. 4 is a view illustrating, in association with schematic cross sections of the stator of the rotating electrical machine and the electric field reduction system 3, the test location-to-surface potential characteristics in the surface potential measurement processing. As illustrated in FIG. 4, as a result of measuring the surface potential Vsuf [kV] of the test location from the first position P to the second position Q in the longitudinal direction y, a slope of the surface potential Vsuf [kV] becomes steep from a boundary region between the low resistance layer 14 and electric field reducing layer 15 in the longitudinal direction y. This reveals that a large electric field occurs at the boundary region.

When the surface potential measurement processing is finished (YES in step S28), the computing section 31 outputs the test location-to-surface potential characteristics stored in the surface potential measurement database 33 to the output unit 34. When the output unit 34 is a display, the test location-to-surface potential characteristics are displayed on the display; when the output unit 34 is a printer, the test location-to-surface potential characteristics are printed by the printer (step S29: test location-to-surface potential characteristics output processing).

In step S29, the computing section 31 may compute an electric field E [kV/m] between a first test location L1 [mm] and a second test location L2 [mm] as the different test locations L [mm] from the test location-to-surface potential characteristics stored in the surface potential measurement database 33 and may output a value representing the electric field E [kV/m] to the output unit 34. Assuming that the surface potential Vsuf [kV] at the first test location L1 [mm] is a first surface potential Vsuf1 [kV] and the surface potential Vsuf [kV] at the second test location L2 [mm] is a second surface potential Vsuf2 [kV], the computing section 31 computes the electric field E [kV/m] according to an expression: $E=(Vsuf2-Vsuf1)/(L2-L1)$. The first test location L1 [mm] and the second test location L2 [mm] may be arbitrarily selected, or the second test location L2 [mm] may be selected as a next test location of the first test location L1.

As described above, the surface potential distribution measuring device 1 according to the first embodiment uses the Pockels crystal 23 disposed between the laser 21 and the surface (test location L) of the electric field reduction system 3. That is, the Pockels effect brought about by the Pockels crystal 23 is utilized. Thus, when the laser light is emitted from the laser 21 toward the test location L, the light intensity of the laser light reflected by the mirror 24 disposed between the Pockels crystal 23 and the test location L corresponds to the output voltage VPout, which is a potential difference between the first end surface of the Pockels crystal 23 and the second end surface thereof. Therefore, the surface potential distribution measuring device 1 can measure the surface potential Vsuf of the electric field reduction system 3 from the light intensity (output voltage VPout) of the laser light.

The surface potential distribution measuring device 1 according to the first embodiment uses the light detector 25 having a band following a high-frequency component of the inverter pulse voltage. Thus, even when the inverter pulse voltage is generated, the light intensity of the laser light reflected by the mirror 24 disposed between the Pockels crystal 23 and the test location L is detected by the light detector 25. Therefore, the surface potential distribution measuring device 1 can measure, from the light intensity (output voltage VPout) of the laser light, the surface potential Vsuf of the electric field reduction system 3 in which the inverter pulse voltage is generated.

When the different input voltages Vin are applied to the rear surface of the mirror 24 in the voltage calibration processing to be performed before the test, the surface potential distribution measuring device 1 according to the first embodiment stores, in the voltage calibration database 32, the input-to-output voltage characteristics representing a relationship between the different input voltages Vin and their corresponding output voltages VPout (detection light intensities Pout detected by the light detector 25) of the Pockels crystal 23. Thus, when a part of the surface of the electric field reduction system 3 is set as the test location L at the rear side of the mirror 24 in the surface potential measurement processing to be performed during the test, the output voltage VPout (detection light intensity Pout detected by the light detector 25) of the Pockels crystal 23 obtained when a voltage is applied to the stator coil is set as the output voltage Vout [V] at test time. The input voltage Vin corresponding to the output voltage Vout at test time can be identified as the surface potential Vsuf of the electric field reduction system 3 from the input-to-output voltage characteristics stored in the voltage calibration database 32.

In the surface potential distribution measuring device 1 according to the first embodiment, a metal material is not used as the measurement point (test location), disturbance to the measurement point can be minimized.

As described above, according to the surface potential distribution measuring device 1 of the first embodiment, the surface potential of the electric field reduction system in which the inverter pulse voltage is generated can be measured.

Second Embodiment

A second embodiment will be described only for different portions thereof from the first embodiment. Other configurations not described are the same as those of the first embodiment.

Operation of the surface potential distribution measuring device 1 according to the second embodiment will be described.

The surface potential distribution measuring device 1 performs the voltage calibration processing before the test and then performs, during the test, the surface potential measurement processing and the potential difference computing processing to be described later. To the computing section 31, the voltage calibration processing is set, or a combination of the surface potential measurement processing and potential difference calculation processing is set by, e.g., the input operation of the operator.

Figure 7:
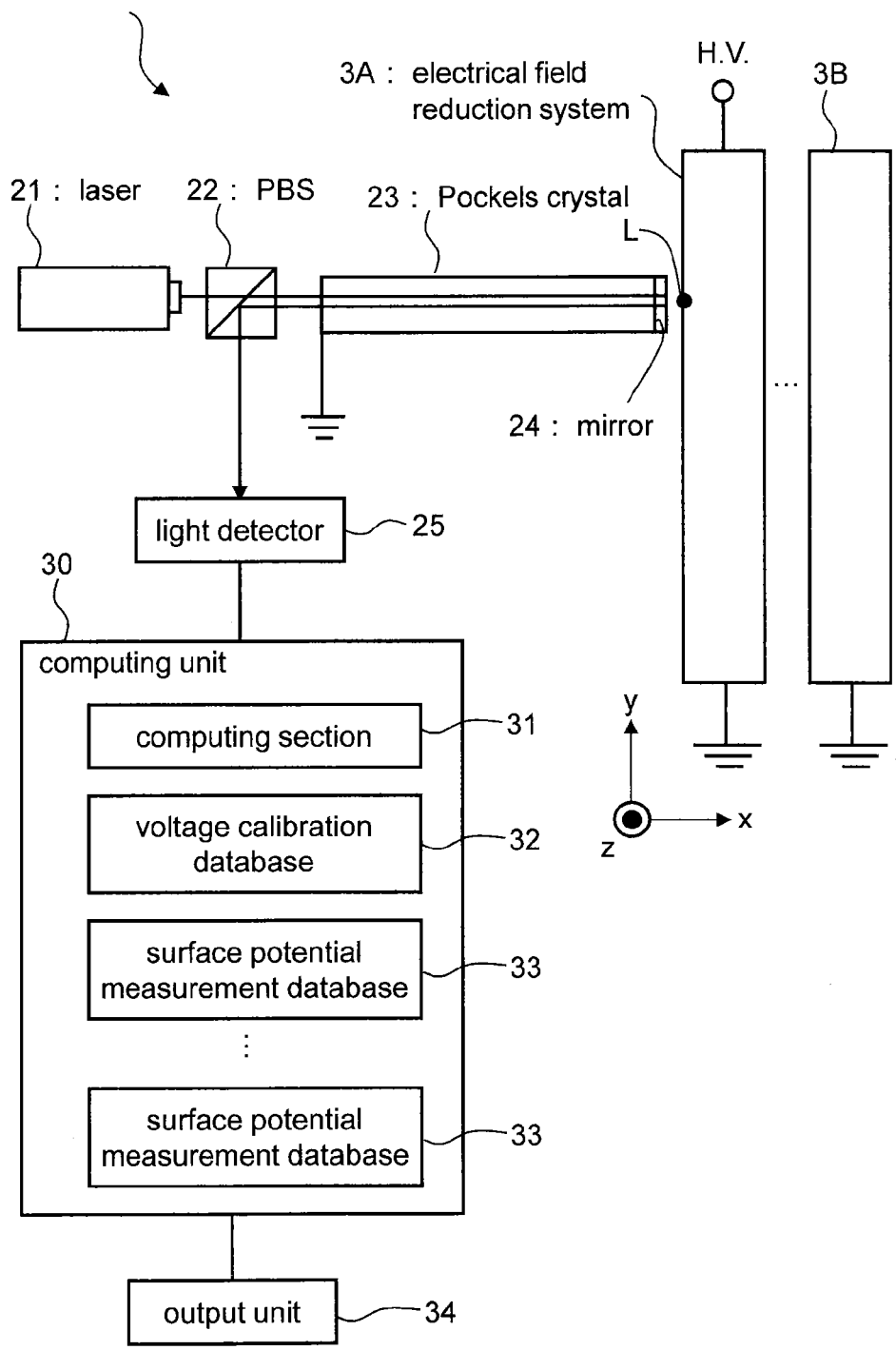
FIG. 7 is a block diagram illustrating a configuration of the surface potential distribution measuring device according to a second embodiment.

FIG. 7 is a block diagram illustrating a configuration of the surface potential distribution measuring device 1 according to the second embodiment.

A plurality of the surface potential measurement databases 33 are assigned corresponding to a plurality of different electric field reduction systems 3. That is, the surface potential measurement databases 33 are provided in the computing unit 30 corresponding to the number of the electric field reduction systems 3.

FIG. 8 is a flowchart illustrating an example of the potential difference computing processing.

First, the surface potential measurement processing is performed for a first electric field reduction system 3A and a second electric field reduction system 3B which are disposed adjacent to each other. In this state, the potential difference computing is set to the computing section 31 (step S31: potential difference computation setting).

In the potential difference computing, the computing section 31 performs the following processing.

The computing section 31 checks whether the same test location L is stored in the surface potential measurement databases 33 assigned respectively to the first electric field reduction system 3A and the second electric field reduction system 3B (step S32).

When the same test location L is stored (YES in step S32), the computing section 31 computes a surface potential difference VAB [kV] which is a potential difference between a surface potential Vsuf [kV] of the first electric field reduction system 3A at the test location L and a surface potential Vsuf [kV] of the second electric field reduction system 3B at the test location L. Assuming that the surface potential Vsuf [kV] of the first electric field reduction system 3A is set to a first electric filed reduction system surface potential Vsuf31 [kV] and surface potential Vsuf [kV] of the second electric field reduction system 3B is set to a second electric filed reduction system surface potential Vsuf32 [kV], the computing section 31 computes the surface potential difference VAB [kV] according to an expression: VAB=Vsuf 32−Vsuf 31 (step S33: surface potential difference computing).

When the surface potential measuring is finished (YES in step S34), the computing section 31 outputs the test location-to-surface potential characteristics and the value representing the electric field E [kV/m] to the output unit 34 and, at the same time, outputs the surface potential difference VAB [kV] to the output unit 34 (step S35: surface potential difference output processing).

As described above, according to the surface potential distribution measuring device 1 of the second embodiment, the potential difference between the adjacent electric field reduction systems 3 can be measured.

Although the preferred embodiments of the present invention have been described above, the embodiments are merely illustrative and do not limit the scope of the present invention. These novel embodiments can be practiced in other various forms, and various omissions, substitutions and changes may be made without departing from the scope of the invention. The embodiments and modifications thereof are included in the scope or spirit of the present invention and in the appended claims and their equivalents.

EXPLANATION OF REFERENCE SYMBOLS

1: surface potential distribution measuring device
3: electric field reduction system
11: stator core
12: coil conductor
13: main insulating layer
14: low resistance layer
15: electric field reducing layer
16: stator coil end
17: end portion of the low resistance layer
21: laser (semiconductor laser generator)
22: PBS
23: Pockels crystal
24: mirror (dielectric mirror)
25: light detector
30: computing unit
31: computing section
32: voltage calibration database
33: surface potential measurement database
34: output unit

The invention claimed is:
1. A surface potential distribution measuring device comprising:
a laser configured to emit laser light;
a Pockels crystal, extending to a longitudinal direction along the direction of the laser light, configured to receive, at its first end surface, the laser light emitted from the laser;
a mirror having a mirror surface mounted at a second end surface of the Pockels crystal and configured to reflect the laser light incident from the first end surface of the Pockels crystal in a direction opposite to an incident direction of the laser light;
a light detector having a band following a high-frequency component of a pulse voltage and configured to receive the laser light reflected by the mirror and detecting, as a light intensity of the laser light, a detection light intensity corresponding to an output voltage which is a potential difference between the first end surface of the Pockels crystal and the second end surface thereof;
a voltage calibration database configured to store, when a plurality of mutually different input voltages are applied to a rear surface of the mirror in voltage calibration processing to be performed before a test, input-to-output voltage characteristics representing a relationship between the different input voltages and the output voltages of the Pockels crystal obtained when the different input voltages are applied to the rear surface of the mirror; and a computing section configured to set, when a part of a surface of an object to be measured is set at a rear side of the mirror as a test location in surface potential measurement processing to be performed during the test, the output voltage of the Pockels crystal obtained when a voltage is applied to the object as an output voltage at test time and identifying an input voltage corresponding to the output voltage at test time as the surface potential of the object based on the input-to-output voltage characteristics stored in the voltage calibration database, wherein the first end surface of the Pockels crystal is grounded.

2. The surface potential distribution measuring device according to claim 1, wherein the detection light intensity is represented by a cosine function of the output voltage, and the computing section uses the cosine function to derive the output voltage of the Pockels crystal from the detection light intensity.

3. The surface potential distribution measuring device according to claim 2, further comprising a polarization beam splitter (PBS) that transmits therethrough only a linearly polarized light, wherein the laser emits the laser light which is the linearly polarized light in the incident direction perpendicular to a longitudinal direction of the object, the PBS transmits therethrough the laser light emitted from the laser in the incident direction, the Pockels crystal, which is disposed such that a longitudinal direction thereof is parallel to the incident direction and is disposed in line with the laser and the PBS in the incident direction, receives the laser light from the PBS at its first end surface, the PBS transmits therethrough the laser light reflected by the mirror in the longitudinal direction of the object, and the light detector, which is disposed in the longitudinal direction of the object with respect to the PBS, receives the laser light from the PBS.

4. The surface potential distribution measuring device according to claim 1, wherein the object further comprises two end portions, when one end portion is set as a first position and any other end portion thereof is set as a second position, the test location is represented by a distance extending in the longitudinal direction of the object from the first position, and when the test location is set at a plurality of mutually different positions in an area from the first position to a second position with respect to the rear surface of the mirror in the surface potential measurement processing, the computing section generates test location-to-surface potential characteristics representing a relationship between a plurality of mutually different test locations and the surface potentials of the object identified when the different test locations are set with respect to the rear side of the mirror.

5. The surface potential distribution measuring device according to claim 4, further comprising a surface potential measurement database, wherein when the test location is set at a plurality of mutually different positions in an area from the first position to the second position with respect to the rear surface of the mirror in the surface potential measurement processing, the computing section stores the test locations and the surface potentials of the object obtained at the test in the surface potential measurement database to generate the test location-to-surface potential characteristics.

6. The surface potential distribution measuring device according to claim 4, wherein the device further comprises an output unit, and in the surface potential measurement processing, the computing section outputs the test location-to-surface potential characteristics to the output unit.

7. The surface potential distribution measuring device according to claim 4, wherein in the surface potential measurement processing, the computing section computes an electric field between a first test location and a second test location as the different test locations from the test location-to-surface potential characteristics.

8. The surface potential distribution measuring device according to claim 1, wherein the at least one object includes first and second objects which are disposed adjacent to each other, and when the surface potential measurement processing is performed for adjacently disposed first object and second e object, the computing section computes a surface potential difference which is a potential difference between a surface potential of the first object at a given test location and a surface potential of the second object at the same test location as the given test location.

9. The surface potential distribution measuring device according to claim 1, wherein the Pockels crystal is a Bi12GeO20 crystal.

10. A surface potential distribution measuring method comprising:

emitting, using a laser, laser light from a first end surface of a Pockels crystal to a second end surface thereof, the Pockels crystal extending to a longitudinal direction along the direction of the laser light;

reflecting, using a mirror having a mirror surface mounted at the second end surface of the Pockels crystal, the laser light incident thereto from the first end surface of the Pockels crystal in a direction opposite to an incident direction of the laser light;

detecting, using a light detector, having a band following a high-frequency component of an inverter pulse voltage, the laser light reflected by the mirror and detecting, as a light intensity of the laser light, where a detection light intensity corresponds to an output voltage which is a potential difference between the first end surface of the Pockels crystal and the second end surface thereof;

storing, in a voltage calibration database, when a plurality of mutually different input voltages are applied to a rear surface of the mirror in voltage calibration processing to be performed before a test, input-to-output voltage characteristics representing a relationship between the different input voltages and the output voltages of the Pockels crystal obtained when the different input voltages are applied to the rear surface of the mirror; and setting, with circuitry, when a part of a surface of an object to be measured is set at a rear side of the mirror as the test location in surface potential measurement processing to be performed during the test, the output voltage of the Pockels crystal obtained when a voltage is applied to the object as an output voltage at the test and identifying an input voltage corresponding to the output voltage at the test as the surface potential of the object based on the input-to-output voltage characteristics stored in the voltage calibration database,
wherein the first end surface of the Pockels crystal is grounded.

11. The surface potential distribution measuring device according to claim 1, where the object is an electric field reduction system applied to a stator coil end which is an end portion of a stator coil of a rotating electrical machine.

12. The surface potential distribution measuring method according to claim 10, where the object is an electric field reduction system applied to a stator coil end which is an end portion of a stator coil of a rotating electrical machine.

* * * * *